United States Patent
Zhu et al.

(10) Patent No.: US 7,106,096 B2
(45) Date of Patent: Sep. 12, 2006

(54) CIRCUIT AND METHOD OF CONTROLLING INTEGRATED CIRCUIT POWER CONSUMPTION USING PHASE CHANGE SWITCHES

(75) Inventors: Huilong Zhu, Poughkeepsie, NY (US); Hon-Sum Philip Wong, Chappaqua, NY (US); Xinlin Wang, Poughkeepsie, NY (US); David R. Hanson, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/904,460

(22) Filed: Nov. 11, 2004

(65) Prior Publication Data

US 2006/0097775 A1   May 11, 2006

(51) Int. Cl.
G06F 7/38     (2006.01)
H03K 19/173   (2006.01)
H03K 19/096   (2006.01)
G05F 1/10     (2006.01)
G05F 3/02     (2006.01)

(52) U.S. Cl. .................... 326/37; 326/38; 326/95; 326/98; 327/544

(58) Field of Classification Search ........... 326/37–38, 326/95, 98; 327/544
See application file for complete search history.

(56) References Cited

U.S. PATENT DOCUMENTS

| | | | |
|---|---|---|---|
| 4,015,185 A | 3/1977 | Pollmeier | |
| 4,620,968 A | 11/1986 | Michel et al. | |
| 5,177,567 A * | 1/1993 | Klersy et al. | 257/4 |
| 5,408,144 A | 4/1995 | Sakata et al. | |
| 5,448,198 A * | 9/1995 | Toyoshima et al. | 327/530 |
| 5,880,604 A * | 3/1999 | Kawahara et al. | 326/83 |
| 6,144,512 A | 11/2000 | Eden | |
| 6,342,277 B1 | 1/2002 | Sherman | |
| 6,393,167 B1 | 5/2002 | Davis et al. | |
| 6,487,106 B1 | 11/2002 | Kozicki | |
| 6,512,705 B1 | 1/2003 | Koelling et al. | |
| 6,549,447 B1 * | 4/2003 | Fricke et al. | 365/105 |
| 6,584,241 B1 | 6/2003 | Davis et al. | |
| 6,614,584 B1 | 9/2003 | Govorkov et al. | |
| 6,638,820 B1 | 10/2003 | Moore | |
| 6,646,902 B1 | 11/2003 | Gilton et al. | |
| 6,653,193 B1 | 11/2003 | Gilton | |
| 6,696,865 B1 | 2/2004 | Horiguchi et al. | |
| 6,709,887 B1 | 3/2004 | Moore et al. | |
| 6,709,958 B1 | 3/2004 | Li et al. | |
| 6,710,423 B1 | 3/2004 | Moore et al. | |
| 6,727,192 B1 | 4/2004 | Moore et al. | |
| 6,730,547 B1 | 5/2004 | Li et al. | |

(Continued)

OTHER PUBLICATIONS

Pending IBM application entitled, "Connection Device and Method of Forming a Connection Device." U.S. Appl. No. 10/904,460, filed Sep. 15, 2003.

(Continued)

Primary Examiner—Rexford Barnie
Assistant Examiner—Jason Crawford
(74) Attorney, Agent, or Firm—H. Daniel Schnurmann (57) ABSTRACT

A circuit and method of controlling integrated circuit power consumption using phase change switches where the phase change switches switchably couple and decouple power sources to logic blocks in response to a programming voltage.

17 Claims, 6 Drawing Sheets

U.S. PATENT DOCUMENTS

| | | |
|---|---|---|
| 6,730,928 B1 | 5/2004 | Wyeth et al. |
| 6,731,528 B1 | 5/2004 | Hush et al. |
| 6,734,455 B1 | 5/2004 | Li |
| 6,737,312 B1 | 5/2004 | Moore |
| 6,737,726 B1 | 5/2004 | Gilton |
| 6,751,114 B1 | 6/2004 | Gilton et al. |
| 7,030,651 B1 * | 4/2006 | Madurawe .................. 326/41 |
| 2004/0155314 A1 | 8/2004 | Sakata et al. |

OTHER PUBLICATIONS

US 6,693,484, 02/2004, Kang et al. (withdrawn)

* cited by examiner

CIRCUIT AND METHOD OF CONTROLLING INTEGRATED CIRCUIT POWER CONSUMPTION USING PHASE CHANGE SWITCHES

BACKGROUND OF THE INVENTION

The present invention relates to circuits and methods for controlling integrated circuit power consumption, and particularly, to circuits and methods incorporating phase change switches.

Power consumption increasingly has become a major obstacle to circuit and system designers. Advances in integrated circuit (IC) technology have resulted in millions of transistors being placed on single ICs. Additionally, IC technology advances have enabled circuits to switch at increasingly faster speeds. As the physical sizes of ICs continue to shrink while at the same time performance (i.e. switching speed) increases, power density substantially increases. This substantial increase in power density causes power management problems for system designers. Power management problems may be manifested in various forms such as, for example: heat dissipation, battery life, performance, and reliability. As the amount of power dissipated by conventional ICs increases while chip area decreases, significant thermal control issues at the system level arise. The problem has become so pervasive that conventional forced air cooling systems are no longer able to dissipate the power generated by modern ICs. System designers are required to utilize liquid cooled solutions for handling ever increasing power dissipation requirements. Increased power consumption also creates battery life issues in portable systems and can significantly impact the usefulness of portable devices.

Conventional circuit techniques for reducing power consumption in integrated circuits typically comprise the use of transistors as switches for isolating one or more blocks of logic from power sources. When the logic block(s) is in use, the switches are closed, thus coupling the logic block to the power sources. When the logic block(s) is not in use (e.g. low power or standby mode), the switches are opened, thus decoupling the logic block(s) from the power sources. Various transistor switch-based circuit techniques for reducing power consumption are well known in the art. For example, U.S. Pat. No. 6,693,484 (the '484 patent) assigned to The Regents of The University of California on Feb. 17, 2004, entitled "Low-power high-performance integrated circuit and related methods" discloses such conventional circuitry. For example, FIG. 1 of the '484 patent illustrates two isolation transistors Q1 and Q2 that are positioned between a logic block (e.g. an inverter circuit) and power and ground sources, respectively, and couple the logic block to those sources. When the logic block is to be activated, control signals switch both Q1 and Q2 on, thus activating the logic block. When the logic block is to be deactivated, control signals switch both Q1 and Q2 off, thus isolating the logic block from the power and ground sources, respectively, thereby deactivating the logic block.

There have been shortcomings with conventional transistor switch-based power reduction techniques. Mainly, leakage current is generated when the isolation transistors decouple the logic block(s) from the power sources. This leakage current is directly proportional to the off impedance of the isolation transistor. The off impedance of a typical FET transistor is approximately $1 \times 10^7$ Ohms/um. In certain applications, such as low power and thermally sensitive applications, such an off impedance value may not be sufficient. Additionally, as the density of ICs continues to rise, and thus more transistors can be placed on a chip, the off-state leakage current associated with de-activated circuits can increase to the point of limiting or even inhibiting the operation of the system in which the IC resides. Thus, it would be desirable to use a switch-based circuit technique for reducing power consumption where the switch mechanism has a higher off impedance as compared to conventional transistors.

Additionally, the size of conventional isolation transistors must be very large to accommodate source/sink currents. The amount of source/sink current is directly proportional to the on impedance value of an isolation transistor. The on impedance of atypical FET transistor is approximately 600 Ohms/um. The size (i.e. width) of an isolation transistor is determined by the amount of current required by the logic block to which the transistor is coupled when the logic block is active. Thus, the greater the current demand, the larger the isolation transistors must be to accommodate that demand. Conventional integrated circuit designs require very large isolation transistors in order to accommodate high current load requirements. Large transistors negatively impact the overall size of an IC. Additionally, as the density of ICs continues to rise, and thus more transistors can be placed on a chip, more isolation transistors may be required for power management purposes, thus having a greater negative impact on the size of ICs. Thus, it would be desirable to use a switch-based circuit technique for reducing power consumption where the switch mechanism has a lower on impedance as compared to conventional transistors.

BRIEF SUMMARY OF THE INVENTION

The present invention addresses the above-described problems by providing a circuit for controlling integrated circuit power consumption by using phase change switches. In accordance with one aspect of the invention, power consumption is controlled by coupling at least one phase change switch to at least one logic block and configuring the phase change switch in either a low impedance crystalline state or a high impedance amorphous state.

The phase change switches may advantageously be configured according to a programming voltage. The programming voltage may be set to a low programming voltage, a high programming voltage, or ground in response to a control signal.

Furthermore, a plurality of boosted voltages may be generated where one of the boosted voltages corresponds to a low programming voltage and another of the boosted voltages corresponds to a high programming voltage.

According to another aspect of the invention, integrated circuit power consumption is controlled by using phase change switches that comprise a phase change material, a heating element, and an insulator surrounding the phase change material. The phase change material may comprise a chalcogenide.

According to a further aspect of the invention, power consumption of an integrated circuit is controlled by using phase change switches by receiving at least one control signal, supplying a programming voltage to at least one phase change switch in response to the control signal, and configuring the phase change switch in response to the programming voltage.

Further and still other aspects of the present invention will become more readily apparent when the following detailed description is taken in conjunction with the accompanying drawing figures.

DETAILED DESCRIPTION OF PREFERRED EMBODIMENTS OF THE INVENTION

The present invention provides a circuit and method of controlling integrated circuit power consumption using phase change switches. Phase change switches can reduce power consumption of logic block(s) by isolating the logic block(s) from power sources when the logic block(s) are non-operational. Logic block(s) can be non-operational for various reasons, such as, for example: the logic block(s) is non-functional, the logic block(s) is defective, low power modes, standby modes, etc.

In exemplary embodiments of the invention, the phase-change switches (PCSs) are re-configurable switches in which conductivity of the switch is changed by altering the phase of the phase change material. However, it should be appreciated that PCSs can be any other type of re-configurable material capable of changing from a high conductive state to a low conductive state. For example, the PCSs can be of the magnetic tunnel junction (MTJ) type, in which the tunneling current depends on the relative orientation of magnetizations of two ferromagnetic layers, which can be changed by an applied magnetic field. In exemplary embodiments of the invention, PCSs can be of the kind disclosed in co-pending U.S. patent application Ser. No. 10/662,709, published to the assignee hereof and incorporated herein by reference in its entirety, entitled "Connection Device and Method of Forming a Connection Device."

Figure 1:
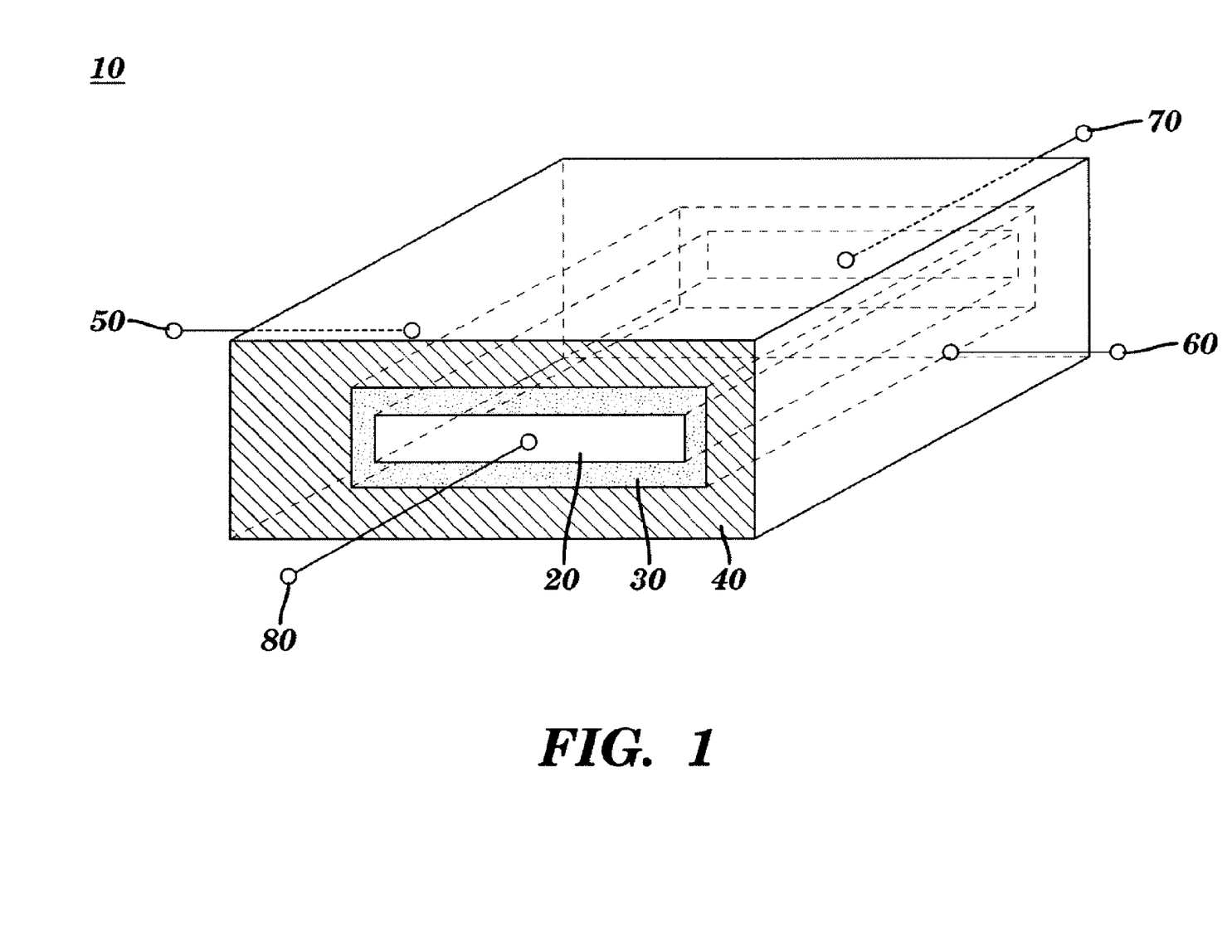
FIG. 1 is a diagram illustrating a phase change switch according to an embodiment of the present invention.

Alternatively, in exemplary embodiments of the invention, the PCSs can be of the kind as illustrated in FIG. 1. The PCS 10 of FIG. 1 includes phase change material 20 and an insulator 30. The insulator 30 surrounds phase change material 20. The phase change material 20 can be any suitable phase change material, preferably chalcogenides, such as, for example, GST ($Ge_2Sb_2Te_5$). A chalcogenide material has a variable resistivity depending on the crystalline state of the material. In an amorphous state, the resistivity of the material is high, whereas in the crystalline state, the resistivity of the material is low.

The phase conversion can be accomplished by appropriate heating and cooling of the chalcogenide material. Once the chalcogenide material melts, the material loses all crystalline structure, and rapid cooling of the material to below its glass transition temperature causes the material to be locked into an amorphous state. The amorphous phase is very stable near room temperature, but the rate of nucleation and growth of crystallites increases exponentially as the melting temperature is approached. To keep the material from recrystallizing during cooling, the cooling rate must be faster than the crystal nucleation and growth rate. To switch the chalcogenide material to a conductive state, the material can be heated to a temperature between the glass transition temperature and the melting temperature, causing nucleation and crystal growth to rapidly occur over a period of several nanoseconds.

The typical impedance of a chalcogenide material in the crystalline state is approximately 50 Ohms/um. The typical impedance of a chalcogenide material in the amorphous state is approximately $5 \times 10^7$ Ohms/um, thus resulting in a crystalline to amorphous impedance ratio of approximately $10^6$. The resistivity of GST can be tuned, for example, by doping the GST with nitrogen.

Heating element 40 of the present embodiment heats phase change material 20 in response to a voltage applied across the first terminal 50 and the second terminal 60. The heating element 40 of the present embodiment can be any suitable resistive heating element, such as, for example, polysilicon. It will be understood by those skilled in the art that the heating element 40 can be any other element that can change the PCS 10 between a conductive state and a non-conductive state. For example, if PCS 10 includes a magnetic tunnel junction, then the heating element 40 can be any suitable element that applies a variable magnetic field, such as an electromagnetic circuit.

In the present embodiment, a programming circuit (not shown) is electrically connected to PCS 10 through the first terminal 50 and the second terminal 60. The programming circuit can be any suitable circuit that generates, controls and inputs a programming voltage Vprog to the terminals 50 and 60, which in turn determines the amount of current that will flow through the heating element 40. The programming circuit inputs a programming voltage Vprog+ to the first terminal 50 to create a current Iprog that flows from the first terminal 50 to the second terminal 60 through the heating element 40. The current Iprog is applied as a short pulsed current through the heating element 40, which in turn heats up due to its electrical resistance. The short pulsed current through the heating element 40 provides Joule heat to the phase change material 20 to induce phase change.

To configure the PCS 10 in a low impedance crystalline state, the programming circuit provides a low current Iprog through the heating element 40, which in turn heats up, but does not melt, the phase change material 20 to permit crystallization (low resistivity state). To configure the PCS 10 in a high impedance amorphous state, the programming circuit provides a high current Iprog through the heating element 40, which in turn melts the phase change material 20. Subsequent cooling of the phase change material 20 places the material in the amorphous state (high resistivity state). The configuration operations are reversible and occur in less than 100 ns.

Insulator 30 surrounds phase change material 20 and electrically insulates the phase change material 20 from the heating element 40. Insulator 30 can be made of any suitable electrical insulating material, for example, a dielectric material such as silicon dioxide. In other embodiments of the invention, rather than using an insulator 30, the phase change material 20 can be electrically isolated from the heating element 40 by forming a p-n junction between the phase change material 20 and the heating element 40. For example, an n-doped polysilicon layer can be used as the heating element 40, which forms a p-n junction with phase change material 20. Using a p-n junction rather than an insulator improves thermal contact between the heating element 40 and the phase change material 20.

In general, the programming current Iprog is preferably small to reduce power consumption and eliminate the need to deliver a very large current during programming. In various exemplary embodiments of the invention, the current Ipcs that flows through the phase change material 20 from power-in terminal 70 to power-out terminal 80 is separate from the programming current Iprog that allows for joule heating of the phase change material 20. This allows for the use of a small programming current Iprog to control the resistivity of the phase change material 20, which in turn can pass large currents Ipcs without inducing phase change.

Figure 2:
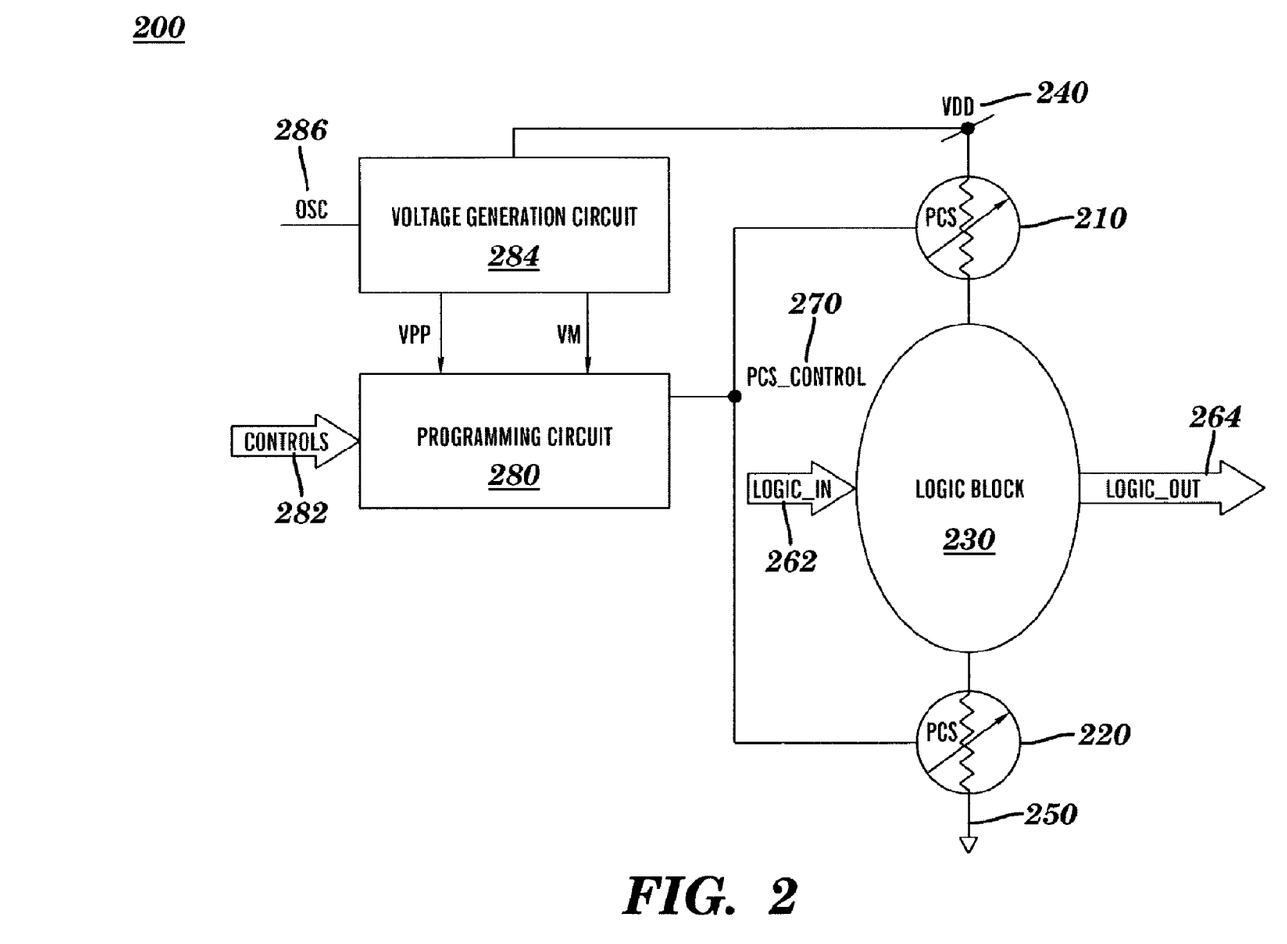
FIG. 2 is a diagram illustrating an exemplary embodiment of a circuit for controlling integrated circuit power consumption according to the present invention.

FIG. 2 illustrates an exemplary embodiment of a circuit 200 for controlling integrated circuit power consumption according to the invention. First PCS 210 provides a switchable connection between first power source 240 and logic block 230. Second PCS 220 provides a switchable connection between logic block 230 and second power source 250. PCSs 210 and 220 function as header and footer devices between logic block 230 and first and second power sources 240 and 250, respectively. When active, the header and footer devices couple power sources 240 and 250 to logic block 230 and source/sink current from the power sources to the logic block, respectively. When the header and footer devices are disabled (i.e. inactive), power sources 240 and 250 are isolated, or decoupled, from logic block 230 and the leakage current is limited by the off-impedance of PCSs 210 and 220, respectively. Thus, first PCS 210 and second PCS 220 provide switchable connections between logic block(s) and power sources. The power sources of the present invention can be any suitable combination of voltage and/or ground sources (e.g. two voltage sources, a voltage source and a ground source, multiple voltage sources, multiple voltage sources and multiple ground sources, etc.) where the voltage sources can be of the same or different potentials.

Logic block 230 can be any suitable circuit type, including, for example, memory arrays, embedded memory arrays, inverters, logic gates, registers, control logic, dynamic logic, digital circuitry, analog circuitry, mixed signal circuitry, application specific integrated circuit (ASIC) cores, microprocessors, multithreaded processors, etc. For illustrative purposes only, logic block 230 can be an inverter circuit. Signal LOGIC_IN 262 represents input signals to logic block 230, and in the case of an inverter, represents the signal to be inverted. Signal LOGIC_OUT 264 represents output signals from logic block 230, and in the case of an inverter, represents the inverted version of the input signal 262.

Programming circuit 280 determines the state of node PCS_CONTROL 270. Node PCS_CONTROL 270 provides a programming voltage Vprog to PCS 210 and PCS 220 which controls the state (i.e. amorphous or crystalline) of PCSs 210 and 220 as previously described. The programming voltage Vprog is determined by programming circuit 280. In response to control signals 282, programming circuit 280 delivers one of three voltages (ground, VPP, or VM) to PCSs 210 and 220.

When the logic block 230 goes from an operational state (e.g. normal functional operation) to a non-operational state (e.g. non-functional, defective, low power modes, standby modes, etc.), the PCSs are changed from a low impedance crystalline state to a high impedance amorphous state. Control signals 282 cause programming circuit 280 to set node PCS_CONTROL 270 to VPP, a high programming voltage for melting the phase change material as previously described. When the logic block 230 goes from a non-operational state to an operational state, the PCSs are changed from a high impedance amorphous state to a low impedance crystalline state. Control signals 282 cause programming circuit 280 to set node PCS_CONTROL 270 to VM, a low programming voltage for heating, but not melting, the phase change material as previously described. When the logic block 230 is to remain configured in a certain state (i.e. operational or non-operational), control signals 282 cause programming circuit 280 to set node PCS_CONTROL 270 to a ground potential which has no effect on the state of the PCSs. Programming circuit 280 can be any suitable circuit for controlling which one of a plurality of programming voltages is to be supplied to the PCSs. For example, programming circuit 280 can be two level-shifter circuits and three multiplexers.

Voltage generation circuit 284 supplies a first boosted voltage source VM and second boosted voltage source VPP to the programming circuit 280 in response to input signal OSC 286 where VPP>VM. First boosted voltage source VM corresponds to the low programming voltage supplied by programming circuit 280 to node PCS_CONTROL 270. Second boosted voltage source VPP corresponds to the high programming voltage supplied by programming circuit 280 to node PCS_CONTROL 270. Signal OSC 286 is an oscillating input signal. Boosted voltage sources VPP and VM facilitate Joule heating which is used to transition the PCSs from one state to another as previously described. Control signals 282 and signal OSC 286 can be generated by any suitable means such as, for example, another circuit within the IC or can be generated external to the IC. Voltage generation circuit 284 can be any suitable means capable of generating a plurality of voltage sources. For example, voltage generation circuit 284 can be a switched charge pump circuit.

To configure PCS 210 and PCS 220 in a low impedance crystalline state, programming circuit 280 provides a low programming voltage at node PCS_CONTROL 270 in response to control signals 282, where node PCS_CONTROL 270 then in turn causes PCS 210 and PCS 220 to become crystalline as previously described, thus configuring the respective PCSs in a low impedance state. When PCSs 210 and 220 are in a low impedance state, logic block 230 is electrically coupled to first power source 240 and second power source 250 through very low impedance connections. PCSs have an on impedance of approximately 50 Ohms/um, about ten times smaller than that of conventional transistors. Therefore, a similarly sized PCS can accommodate ten times the current load as compared to a conventional transistor. Alternatively, the size of a conventional isolation transistor must be about ten times larger than that of a PCS to accommodate the same current load, thus negatively impacting the overall size of a chip design.

To configure PCS 210 and PCS 220 in a high impedance amorphous state, programming circuit 280 provides a high programming voltage at node PCS_CONTROL 270 in response to control signals 282, where node PCS_CONTROL 270 then in turn causes PCS 210 and PCS 220 to become amorphous as previously described, thus configuring the respective PCSs in a high impedance state. When the PCSs 210 and 220 are in a high impedance state, logic block 230 is electrically decoupled from power source 240 and power source 250 through very high impedance connections. PCSs have an off impedance of approximately $5 \times 10^7$ Ohms/um, about five times greater than that of conventional isolation transistors. Therefore, an IC that incorporates PCSs for controlling power consumption can benefit from approximately a 5× reduction in leakage current as compared to an IC incorporating conventional transistors. Such a reduction in leakage current results in a substantial power savings which is especially critical in low power and mobile applications.

Figure 3:
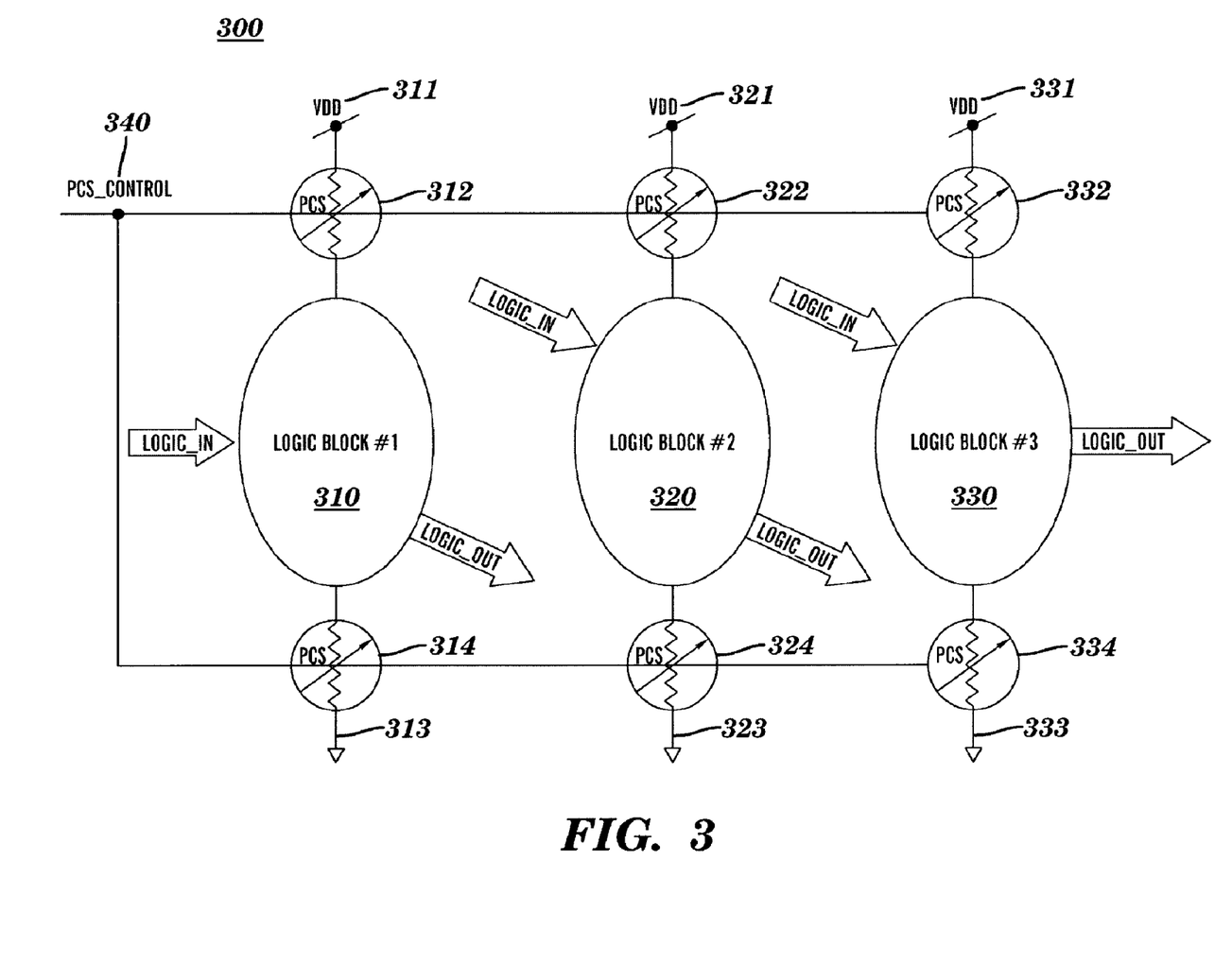
FIG. 3 is a diagram illustrating another exemplary embodiment of a circuit for controlling integrated circuit power consumption according to the present invention.

FIG. 3 illustrates another exemplary embodiment of a circuit 300 for controlling integrated circuit power consumption according to the invention, where circuit 300 comprises a plurality of logic blocks, each logic block being switchably connected to power sources through PCSs. A first logic block 310 is switchably connected to power source 311 through PCS 312 and switchably connected to power source 313 through PCS 314. A second logic block 320 is switchably connected to power source 321 through PCS 322 and switchably connected to power source 323 through PCS 324. A third logic block 330 is switchably connected to power source 331 through PCS 332 and switchably connected to power source 333 through PCS 334. The PCSs function as previously described. Node PCS_CONTROL 340, which supplies one of a plurality of programming voltages to the PCSs for configuring the PCSs as previously described, can be a single node (as illustrated in FIG. 3) or can be a plurality of nodes, where each node is coupled to at least one set of header and footer devices, where each set of header and footer devices comprises two PCSs as previously described. All logic blocks can be switchably connected to the same power sources (as illustrated in FIG. 3) or, alternatively, can be switchably connected to separate power sources.

Figure 4:
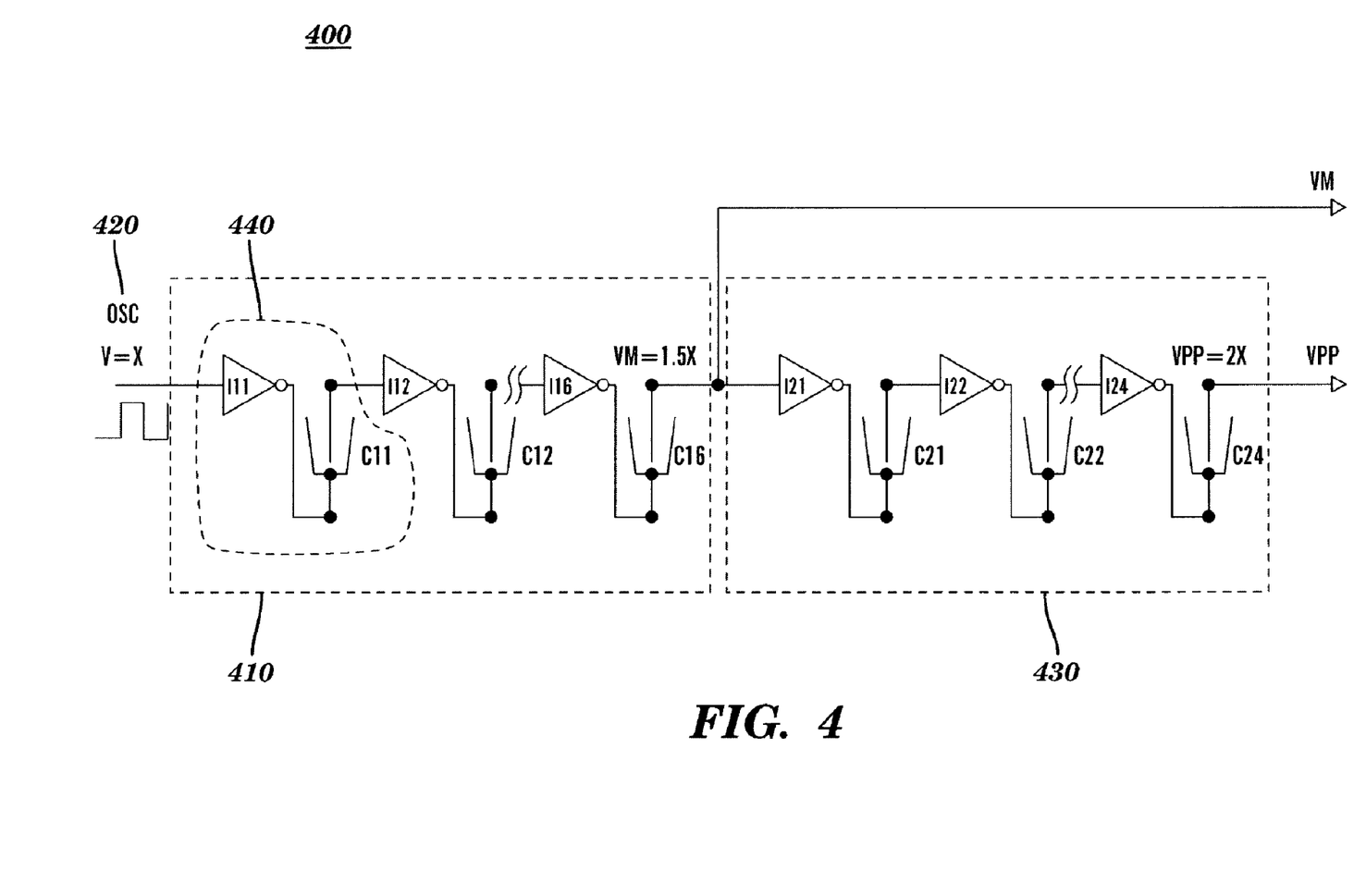
FIG. 4 is a diagram illustrating a charge pump circuit according to an embodiment of the present invention.

FIG. 4 illustrates an exemplary embodiment of the voltage generation circuit 284 of FIG. 2. The charge pump circuit 400 comprises two stages. The first stage 410 pumps the input signal OSC 420 from X volts to a first boosted voltage VM of 1.5*X volts where X can be any suitable voltage. The second stage 430 pumps the output voltage received from the first stage 410 from 1.5*X volts to a second boosted voltage VPP of 2.0*X volts. Signal OSC 420 can be generated by any suitable means such as, for example, a free running oscillator (e.g. usually a phase shift oscillator). First boosted voltage VM is a voltage source of sufficient magnitude to cause the PCSs to re-crystallize, but not to become amorphous, as previously described. Second boosted voltage VPP is a voltage source of sufficient magnitude to cause the PCSs to become amorphous as previously described.

The circuit topology for each pump stage consists of a series of inverter-capacitor components. Each inverter-capacitor component comprises an inverter whose output is coupled to a capacitor network. For example, inverter-capacitor component 440 comprises inverter I11 and capacitor network C11. Since inverter I11 is the first inverter in the first stage, the input to inverter I11 is signal OSC 420. The output of inverter I11 is coupled to the capacitor network C11. The output of capacitor network C11 is coupled to the input of the next inverter-capacitor component. Any suitable number of inverter-capacitor components can be utilized (e.g. I11|C11, I12|C12, . . . , I1n|C1n, where n can be any suitable integer). In the exemplary embodiment illustrated in FIG. 4, the first stage 410 comprises six inverter-capacitor components and the second stage 430 comprises 4 inverter-capacitor components.

The capacitor networks of the first stage (i.e. C11, C12 . . . C16) can be of any suitable capacitance, such as 3Z pF each and the capacitor networks of the second stage (i.e. C21, C22 . . . C24) can be any suitable capacitance, such as Z pF each where Z pF can be any suitable capacitance. Preferably, the capacitance of the first stage is approximately three times greater than the capacitance of the second stage. For illustrative purposes only, the capacitance of the first stage could be 100 pF and the capacitance of the second stage could be 35 pF for capacitor networks of the embedded DRAM type. The capacitor networks can comprise any suitable capacitor elements such as trench capacitors typically used for DRAM memory elements (e.g. 40 fF). For illustrative purposes only, the first stage can contain approximately 150,000 capacitors and the second stage can contain approximately 3,500 capacitors if the capacitors elements of the capacitor networks are trench capacitors. Those skilled in the art will recognize that various combinations of conventional logic circuitry can provide the boosted-voltage functionality as previously described, and thus, are within the scope of the invention. Alternatively, the boosted-voltage sources can originate external to the IC.

Figure 5:
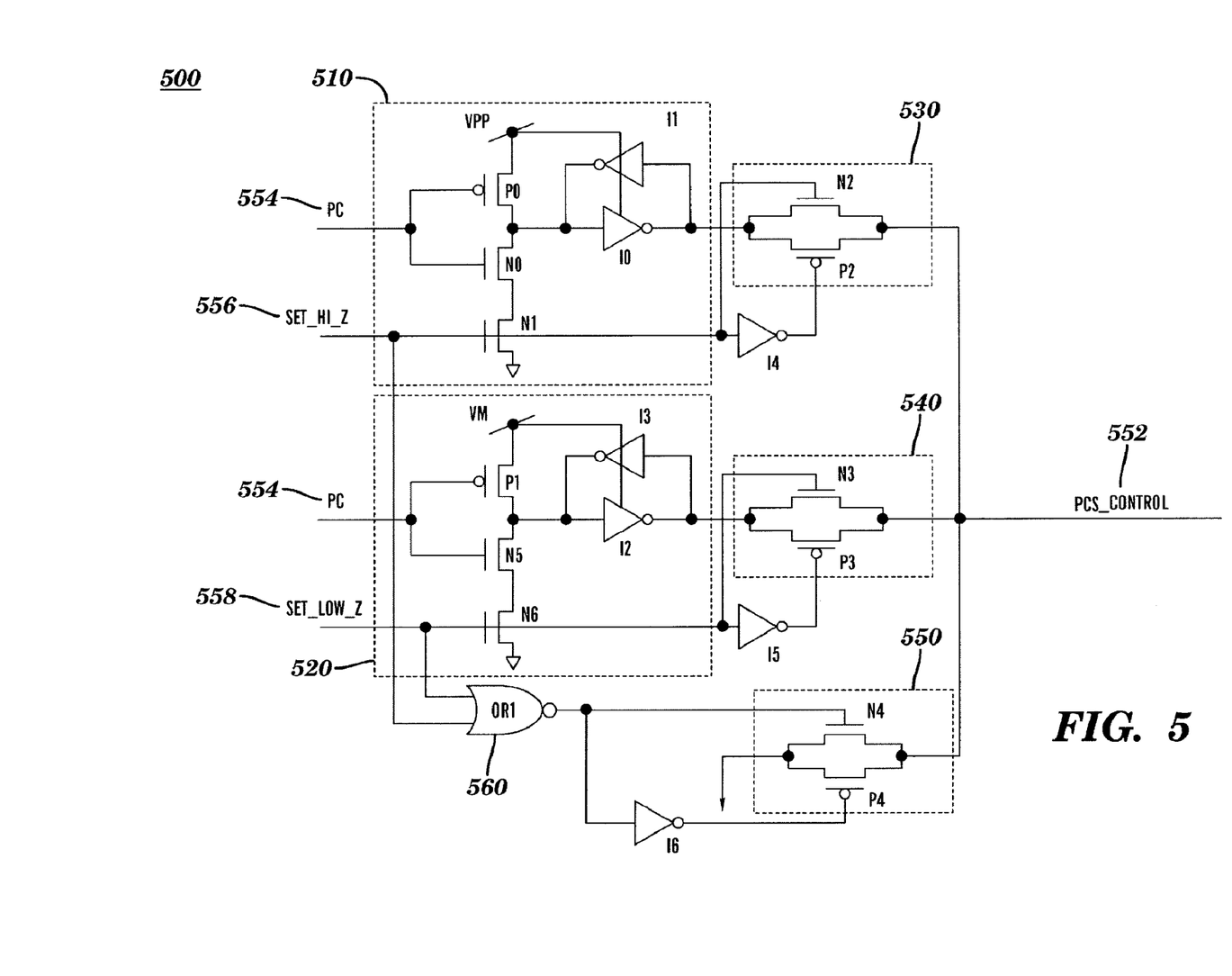
FIG. 5 is a diagram illustrating a phase change switch control circuit according to an embodiment of the present invention.

FIG. 5 illustrates an exemplary embodiment of the programming circuit 280 of FIG. 2. Programming circuit 500 comprises a first level-shifter circuit 510, a second level-shifter circuit 520, a first multiplexer circuit 530, a second multiplexer circuit 540 and a third multiplexer circuit 550. Programming circuit 500 controls what programming voltage, VPP, VM or ground, is to be delivered to node PCS_CONTROL 552. Signals PC 554, SET_HI_Z 556 and SET_LOW_Z 558 are an exemplary embodiment of the controls signals 282 illustrated in FIG. 2.

First level-shifter circuit 510 comprises p-fet P0, n-fet N0, n-fet N1 and inverters I0 and I1. When signal PC 554 is active (i.e. a logic '1'), level shifter 510 shifts the input of first multiplexer 530 to a voltage VPP. First multiplexer 530 comprises n-fet N2 and p-fet P2 and passes voltage VPP to node PCS_CONTROL 552 when signal SET_HI_Z 556 is active (i.e. a logic '1'). Signal SET_HI_Z is a control signal that indicates when the PCSs of the present invention are to be re-configured from a low impedance crystalline state to a high impedance amorphous state and thus require a high programming voltage as previously described. When signal SET_HI_Z 556 is active, a high programming voltage is required as previously described. VPP, a high programming voltage, which can be generated by the voltage generation circuit 284 of FIG. 1 as previously described, is passed from the first level-shifter circuit 510 to node PCS_CONTROL 552 by first multiplexer 530.

Second level-shifter circuit 520 comprises p-fet P1, n-fet N5, n-fet N6 and inverters I2 and I3. When signal PC 554 is active (i.e. a logic '1'), level shifter 520 shifts the input of second multiplexer 540 to a voltage VM. Second multiplexer 540 comprises n-fet N3 and p-fet P3 and passes voltage VM to node PCS_CONTROL 552 when signal SET_LOW_Z 558 is active (i.e. a logic '1'). Signal SET_LOW_Z is a control signal that indicates when the PCSs of the present invention are to be re-configured from a high impedance amorphous state to a low impedance crystalline state and thus require a programming voltage less than VPP as previously described. When signal SET_LOW_Z 556 is active, a low programming voltage is required as previously described. VM, a low programming voltage, which can be generated by the voltage generation circuit 284 of FIG. 1 as previously described, is passed from the second level-shifter circuit 520 to node PCS_CONTROL 552 by second multiplexer 540.

NOR logic gate 560 activates third multiplexer 550 when both signals SET_HI_Z 556 and SET_LOW_Z 558 are inactive (i.e. a logic '0'). Third multiplexer 550 comprises n-fet N4 and p-fet P4. When third multiplexer 550 is active, it passes ground potential to node PCS_CONTROL 552. When both signals SET_HI_Z 556 and SET_LOW_Z 558 are inactive, the PCSs of the present invention are already configured in a desired state and do not need to be reconfigured, and therefore, do not need to receive power. Those skilled in the art will recognize that various combinations of conventional logic circuitry can provide the same PCS control functionality as previously described, and thus, are within the scope of the invention.

Figure 6:
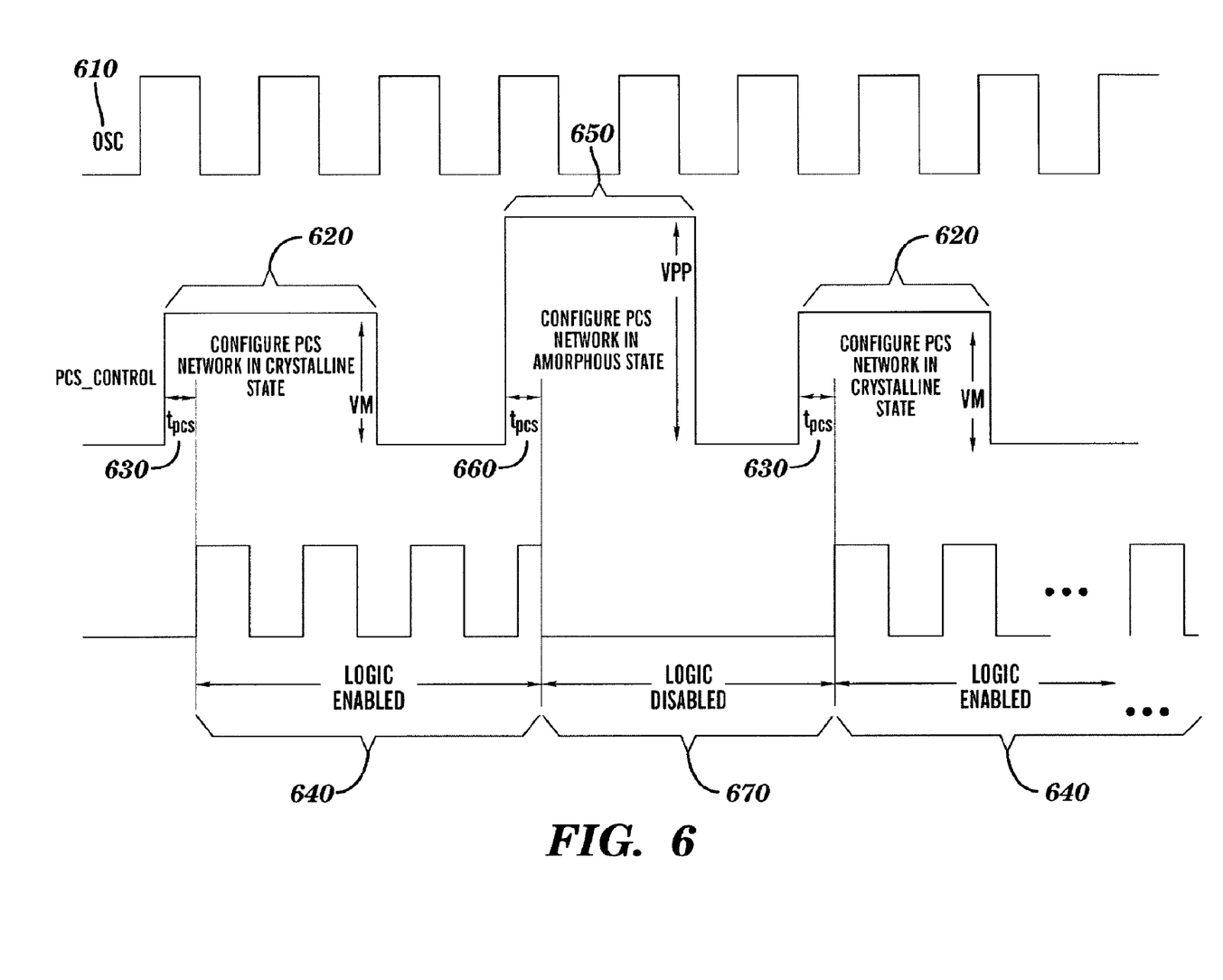
FIG. 6 is a diagram illustrating timing relationships associated with circuits for controlling integrated circuit power consumption according to an embodiment of the present invention

FIG. 6 illustrates the timing relationships associated with circuits for controlling integrated circuit power consumption according to the invention. Signal OSC 610, which is the same signal OSC 286 as illustrated in FIG. 1, is an oscillating input signal as previously described. When the PCS switch network is to be switched from a high impedance amorphous state to a low impedance crystalline state (i.e. switched 'on'), the programming circuit 280 of FIG. 1 passes a low programming voltage to the PCSs as previously described and as illustrated in FIG. 5. The low programming voltage provides enough voltage to the PCSs such that they will be re-configured into a low impedance crystalline state as previously described and as illustrated by the state of node PCS_CONTROL at 620.

A delay occurs from the time when node PCS_CONTROL is set to the low programming voltage to when the PCS network is switched on. This delay is a function of the phase change material composition. For example, the phase change delay for GST is approximately 100 ns as illustrated by time delay $t_{pcs}$ 630. Thus, the logic block(s) that are coupled to the PCS network will remain deactivated (i.e. disabled) for approximately 100 ns after node PCS_CONTROL is set to the low programming voltage. This delay corresponds to the amount of time needed for the phase change material to transition from a high impedance amorphous state to a low impedance crystalline state. Once the phase change material is configured into a low impedance crystalline state, the logic block(s) coupled to the PCSs become active (i.e. enabled) as illustrated by the logic block operational status 640 and as previously described.

When the PCS switch network is to be switched from a low impedance crystalline state to a high impedance amorphous state (i.e. switched 'off'), the programming circuit 280 of FIG. 1 passes a high programming voltage to the PCSs as previously described and as illustrated in FIG. 5. The high programming voltage provides enough voltage to the PCSs such that they will be re-configured into a high impedance amorphous state as previously described and as illustrated by the state of node PCS_CONTROL at 650.

A delay occurs from the time when node PCS_CONTROL is set to the high programming voltage to when the PCS network is switched off. This delay is a function of the phase change material composition. For example, the phase change delay for GST is approximately 100 ns as illustrated by time delay $t_{pcs}$ 660. Thus, the logic block(s) that are coupled to the PCS network will remain activated (i.e. enabled) for approximately 100 ns after node PCS_CONTROL is set to the high programming voltage. This delay corresponds to the amount of time needed for the phase change material to transition from a low impedance crystalline state to a high impedance amorphous state. Once the phase change material is configured into a high impedance amorphous state, the logic block(s) coupled to the PCSs become inactive (i.e. disabled) as illustrated by the logic block operational status 670 and as previously described.

Node PCS_CONTROL can be switched to ground as previously described and as illustrated in FIG. 5 once the PCS network has changed state. FIG. 6 illustrates the case where node PCS_CONTROL remains at either the low programming voltage or the high programming voltage, respectively, for some amount of time after the PCS network has been re-configured. It should be obvious to those skilled in the art that the source supplied to the PCS network can be set to ground any time after the PCS network transitions to the desired state so as to minimize power consumption.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method for controlling power consumption, comprising:
   a logic block;
   a power source;
   a phase change switch adapted to couple the power source to the logic block in accordance with the phase change switch being configured in a low impedance state and adapted to decouple the power source from the logic block in accordance with the phase change switch being configured in a high impedance state, said phase change consisting of a crystalline to amorphous phase change;
   a programming circuit coupled to the phase change switch and adapted to provide a programming voltage to the phase change switch, wherein the phase change switch is configured in accordance with the programming voltage; and
   a voltage generation circuit adapted to supply a first boosted voltage and a second boosted voltage to the programming circuit, wherein the second boosted voltage is greater than the first boosted voltage and the programming voltage corresponds to one of the first boosted voltage, the second boosted voltage, and ground.

2. The circuit of claim 1, wherein the voltage generation circuit comprises a charge pump circuit.

3. The circuit of claim 1, wherein the phase change switch is in the low impedance state in accordance with the programming voltage being a low voltage signal, and the phase change switch is in the high impedance state in accordance with the programming voltage being a high voltage signal.

4. The circuit of claim 3, wherein the high impedance state of the phase change switch is characterized by an impedance of approximately $5 \times 10^7$ Ohms/um and the low impedance state of the phase change switch is characterized by an impedance of approximately 50 Ohms/um.

5. The circuit of claim 1, wherein the phase change switch comprises:
   a phase change material;
   a heating element adapted to heat the phase change material in response to a voltage applied to the heating element; and
   an insulator surrounding the phase change material, wherein the insulator is adapted to electrically isolate the phase change material from the heating element.

6. The circuit of claim 5, wherein the phase change material comprises a chalcogenide.

7. The circuit of claim 6, wherein the chalcogenide comprises $Ge_2Sb_2Te_5$.

8. An integrated circuit, comprising:
   a semiconductor substrate;
   a logic block formed within the semiconductor substrate;
   a power source;

a phase change switch adapted to couple the power source to the logic block in accordance with the phase change switch being configured in a low impedance state and adapted to decouple the power source from the logic block in accordance with the phase change switch being configured in a high impedance state, said phase change consisting of a crystalline to amorphous phase change;

a programming circuit coupled to the phase change switch and adapted to provide a programming voltage to the phase change switch, wherein the phase change switch is configured in accordance with the programming voltage; and a voltage generation circuit adapted to supply a first boosted voltage and a second boosted voltage to the programming circuit, wherein the second boosted voltage is greater than the first boosted voltage and the programming voltage corresponds to one of the first boosted voltage, the second boosted voltage, and ground.

9. The integrated circuit of claim 8, wherein the voltage generation circuit comprises a charge pump circuit.

10. The integrated circuit of claim 8, wherein the phase change switch is in the low impedance state in accordance with the programming voltage being a low voltage signal, and the phase change switch is in the high impedance state in accordance with the programming voltage being a high voltage signal.

11. The integrated circuit of claim 10, wherein the high impedance state of the phase change switch is characterized by an impedance of approximately $5 \times 10^7$ Ohms/um and the low impedance state of the phase change switch is characterized by an impedance of approximately 50 Ohms/um.

12. The integrated circuit of claim 8, wherein the phase change switch comprises:

a phase change material;

a heating element adapted to heat the phase change material in response to a voltage applied to the heating element; and an insulator surrounding the phase change material, wherein the insulator is adapted to electrically isolate the phase change material from the heating element.

13. The integrated circuit of claim 12, wherein the phase change material comprises a chalcogenide.

14. The integrated circuit of claim 13, wherein the chalcogenide comprises $Ge_2Sb_2Te_5$.

15. A method of controlling power consumption of an integrated circuit, comprising the steps of:

receiving at least one control signal, wherein the control signal indicates an operational mode of a logic block;

supplying a programming voltage to a phase change switch in response to the control signal;

configuring the phase change switch in response to the programming voltage, wherein said phase change consists of a crystalline to amorphous phase change; and generating a first boosted voltage and a second boosted voltage, wherein the second boosted voltage is greater than the first boosted voltage and the programming voltage corresponds to one of the first boosted voltage, the second boosted voltage, and ground.

16. The method of claim 15, wherein the programming voltage corresponds to the first boosted voltage in accordance with the control signal indicating that the logic block is to be configured in an operational state, and the programming voltage corresponds to the second boosted voltage in accordance with the control signal indicating that the logic block is to be configured in a non-operational state.

17. The method of claim 15, wherein the programming voltage is applied for at least 100 ns.

* * * * *